(12) United States Patent
Matsuno et al.

(10) Patent No.: US 9,136,832 B2
(45) Date of Patent: Sep. 15, 2015

(54) LEVEL SHIFT CIRCUIT

(71) Applicant: RENESAS ELECTRONICS CORPORATION, Kanagawa (JP)

(72) Inventors: Noriaki Matsuno, Kanagawa (JP); Tatsuhiko Maruyama, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 117 days.

(21) Appl. No.: 13/753,178

(22) Filed: Jan. 29, 2013

(65) Prior Publication Data

US 2013/0196607 A1    Aug. 1, 2013

(30) Foreign Application Priority Data

Jan. 30, 2012   (JP) .................................. 2012-016099
Dec. 20, 2012   (JP) .................................. 2012-278163

(51) Int. Cl.
  *H03K 17/04*   (2006.01)
  *H03K 3/353*   (2006.01)

(52) U.S. Cl.
  CPC ................ *H03K 17/04* (2013.01); *H03K 3/353* (2013.01)

(58) Field of Classification Search
  None
  See application file for complete search history.

(56) References Cited

U.S. PATENT DOCUMENTS

| 7,579,870 | B2 | 8/2009 | Matsumoto et al. |
| 7,812,637 | B2 | 10/2010 | Matsumoto et al. |
| 2008/0191743 | A1 | 8/2008 | Matsumoto et al. |
| 2009/0284282 | A1 | 11/2009 | Matsumoto et al. |
| 2012/0163247 | A1* | 6/2012 | Shimamoto et al. .......... 370/278 |

FOREIGN PATENT DOCUMENTS

| JP | 11-308092 A | 11/1999 |
| JP | 3176339 B2 | 6/2001 |
| JP | 2008199153 A | 8/2008 |

OTHER PUBLICATIONS

Serneels et al, A High speed, Low Voltage to High Voltage Level shifter, 2006 http://web.mit.edu/Magic/Public/papers/04263455.pdf.*

* cited by examiner

*Primary Examiner* — Ping Hsieh
*Assistant Examiner* — James Yang
(74) *Attorney, Agent, or Firm* — Mattingly & Malur, PC

(57) ABSTRACT

A level shift circuit includes a first pair of transistors of the first conductive type (M1, M4) with sources coupled to a pair of input nodes (in, inB) and gates coupled to the first power supply (GND) in common; a second pair of transistors of the second conductive type (M2, M5) with drains coupled to the drains of the first pair of the transistors and the gates coupled to the first power supply in common; a third pair of transistors of the second conductive type (M3, M6) with cross-coupled gates and drains coupled to the sources of the second pair of transistors and the sources coupled to the second power supply (V2) in common; and a pair of capacitive elements (C1, C2) with one ends coupled to the pair of input nodes and the other ends coupled to the drains of the third pair of transistors.

11 Claims, 26 Drawing Sheets

US 9,136,832 B2

LEVEL SHIFT CIRCUIT

REFERENCE TO RELATED APPLICATION

Technical Field

The disclosures of Japanese Patent Applications No. 2012-016099 filed on Jan. 30, 2012, and No. 2012-278163 filed on Dec. 20, 2012 are incorporated herein by reference in their entirety.

The present invention relates to a level shift circuit, in particular, pertaining to such circuits to convert amplitude of an input signal and to output the same.

BACKGROUND

Conventionally, as an interface circuit interconnecting circuits operated in different power supply voltages, various types of level shift circuits are used. As one of the related art references, a circuitry corresponding to such a circuit illustrated in FIG. 6 of Patent Document 1 (Japanese Patent No. 3176339) is shown in FIG. 13. The input signals or 'IN' and 'INB' of this circuit are digital signals whose high and low levels are both within the voltage range of 0V or higher. The output signals 'out' and 'out B' take the positive and negative voltage ranges. With reference to FIG. 13, the state and the node voltage of the respective p-type MOS transistors M11 and M12 coupled to the input nodes 'in' and 'in B' when they are turned on and off are shown in FIG. 14. The signals whose voltages V1 and 0 applied to the input nodes 'in' and 'in B' are converted into signals whose voltages are V1 and V2 or the positive and negative voltage levels at the output terminals 'out' and 'out B'. Further, in this state, at least one of the vertically stacked MOS transistors is in the off-state, so that the flow-through current does not flow. In addition, the voltage applied between arbitrary two terminals among the gates, sources, drains of the respective MOS transistors is less than or equal to V1 or less than or equal to |V2|. That is to say, in spite of the fact that the output voltage amplitude of this circuit is V1+|V2|, it can be comprised of MOS transistors whose maximum applicable voltage is more than or equal to V1 and |V2|. Further, this circuit transmits a DC signal, so that an output state according to an input signal can be obtained from the time of the power-on.

Moreover, in Patent Document 2 (Japanese Unexamined Patent Application Publication No. 2008-199153), such a level shift circuit is disclosed as reducing the voltage between the source and the drain of a transistor and alleviating the high maximum applicable voltage property of such transistors.

[Patent Document 1]
Japanese Patent No. 3176339
[Patent Document 2]
Japanese Patent Kokai Publication No. P2008-199153A

SUMMARY

The following analysis is given according to the present invention.

By the way, as with the circuit shown in FIG. 13, the flow-through current through vertically stacked MOS transistors flows longer than that in the ordinary CMOS circuit, which is explained with reference to FIG. 15. FIG. 15 shows a state change when the On-state of the MOS transistor M11 changes to the Off-state and the Off-state of that M12 changes to the On-state. In the changed states, MOS transistors M12, M4, M5 and M6 are simultaneously turned on, so that the flow-through current larger than that of the ordinary COMS circuit flows. This state continues until the voltages of the coupling nodes of MOS transistors M2 and M3 lower to a sufficient degree. However, MOS transistors M2 and M3 are both in the Off-state, so that the voltages of such coupling nodes slowly changes owing to difference in the subthreshold currents of those transistors M2 and M3. As a result of it, the flow-through current flows far longer than that of the ordinary CMOS circuit.

The case, in which such a level shift circuit is applied to the CMOS switch IC used for switching over an RF signal, is exemplified. With the CMOS switch IC used for an antenna changeover switch of mobile phones and as such, the charge pump circuit is operated with the positive power voltage supplied from the external power source so as to generate the positive voltage V1 and the negative voltage V2. According to the selection of the switch changeover, the V1 is supplied to the gate of the switch transistor to be turned on while the V2 is supplied to that to be turned off. The level shift circuit shown in FIG. 13 can be used for converting an external switch control signal into the signal whose high and low level voltages to be supplied to the gates of the switch transistors are V1 and V2.

The above arrangement makes the flow-through current explained with reference to FIG. 15 flow upon the selected port being changed over. Hereupon, in a CMOS switch IC, a lower current supply capability of such a charge pump circuit is preferred to reduce current consumption. Accordingly, such flow-through current results in lowering the output voltage of such a charge pump. As a result of it, the switching time turns out to be longer by the recovery time of the output voltage of such a charge pump.

According to one aspect of the present invention, the level shift circuit is comprised of a first pair of transistors of the first conductive type, the sources of which first pair of transistors are coupled to a pair of input nodes and the gates of which first pair of transistors are coupled to the first power supply in common; a second pair of transistors of the second conductive type, the drains of which second pair of transistors are coupled to the drains of the first pair of transistors and the gates of which second pair of transistors are coupled to the first power supply in common; a third pair of transistors of the second conductive type, the drains of which third pair of transistors are coupled to the sources of the second pair of transistors and the gates and the drains of which third pair of transistors are cross-coupled to each other as well as the sources of which third pair of transistors are coupled to the second power supply in common; and a pair of capacitative elements, one ends of which elements are coupled to the pair of input nodes and the other ends of which elements are coupled to the drains of the third pair of transistors.

According to other aspect of the present invention, the level shift circuit comprises: a first pair of transistors of a first conductive type, sources of the first pair of transistors being coupled to a pair of input nodes and gates of the first pair of transistors being coupled to a first power supply in common; a second pair of transistors of a second conductive type, drains of the second pair of transistors being coupled to drains of the first pair of transistors and gates of the second pair of transistors being coupled to the first power supply in common; a third pair of transistors of the second conductive type, drains of the third pair of transistors being coupled to sources of the second pair of transistors and gates and drains of the third pair of transistors being cross-coupled to each other; a pair of capacitative elements, one ends of the elements being coupled to the pair of input nodes while other ends of the elements being coupled to the drains of the third pair of transistors; and a resister element, one end of the element being coupled to sources of the third pair of transistors in common while the other end of the element being coupled to a second power supply.

According to another aspect of the present invention, the level shift circuit comprises: a first pair of transistors of a first conductive type, sources of the first pair of transistors being coupled to a pair of input nodes and gates of the first pair of transistors being coupled to a first power supply in common; a second pair of transistors of a second conductive type, drains of the second pair of transistors being coupled to drains of the first pair of transistors and gates of the second pair of transistors being coupled to the first power supply in common; a third pair of transistors of the second conductive type, drains of the third pair of transistors being coupled to sources of the second pair of transistors and gates and drains of the third pair of transistors being cross-coupled to each other; a pair of capacitative elements, one ends of the elements being coupled to the pair of input nodes while other ends of the elements being coupled to the drains of the third pair of transistors; and a third transistor of the second conductive type, a drain of the third transistor being coupled to sources of the third pair of transistors in common, and a source of the third transistor being coupled to a second power supply.

The level shift circuit according to the present invention allows the switching time to be shortened, with the result that the flow-through current in the switchover operation is reduced.

PREFERRED MODES

Figure 1:
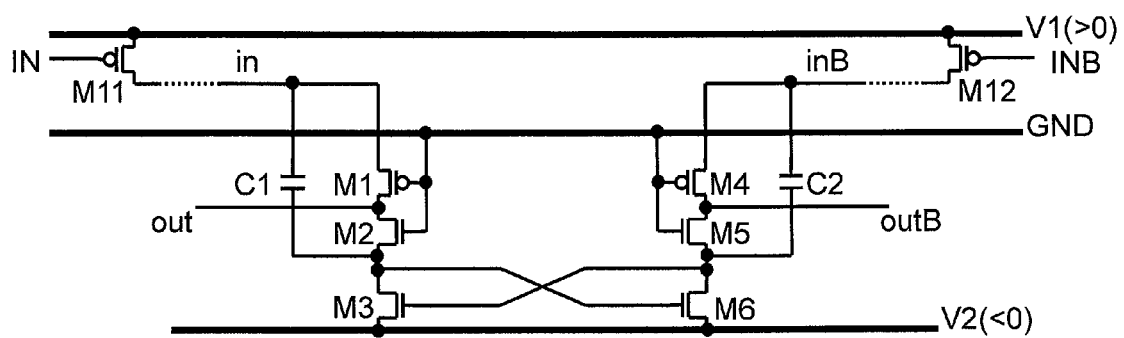
FIG. 1 is a circuit diagram of the level shift circuit according to the first exemplary embodiment of the present disclosure.

Hereafter, the best mode for carrying out the present invention is explained. To note, the reference numerals shown in the accompanying drawings and mentioned below are intended for helping the readers to understand the invention and not intended for limiting the same to what is illustrated in such drawings.

The level shift circuit according to one of the preferred embodiments is comprised of a first pair of transistors of the first conductive type (M1 and M4 shown in FIG. 1), the sources of which first pair of transistors are coupled to a pair of input nodes ('in' and 'in B' shown in FIG. 1) and the gates of which first pair of transistors are coupled to the first power supply (GND shown in FIG. 1) in common; a second pair of transistors (M2 and M5 shown in FIG. 1) of the second conductive type, the drains of which second pair of transistors are coupled to the drains of the first pair of transistors and the gates of which second pair of transistors are coupled to the first power supply in common; a third pair of transistors (M3 and M6 shown in FIG. 1) of the second conductive type, the drains of which third pair of transistors are coupled to the sources of the second pair of transistors and the gates and the drains of which third pair of transistors are cross-coupled to each other as well as the sources of which third pair of transistors are coupled to the second power supply (V2 shown in FIG. 1); and a pair of capacitative elements (C1 and C2 shown in FIG. 1), one ends of which elements are coupled to the pair of input nodes and the other ends of which elements are coupled to the drains of the third pair of transistors.

In the level shift circuit, a resistance element (R1 in FIG. 16) may well be further provided, and sources of the third pair of transistors may well be coupled to the second power supply via the resistance element in common.

In the level shift circuit, a third transistor of the second conductive type (M501 in FIG. 19) functioning as a current source may well be further provided, and sources of the third pair of transistors may well be coupled to a second power supply via the third transistor in common.

In the level shift circuit, the first transistor (M7 shown in FIG. 8) of the second conductive type may well be further provided, the gate of which transistor is coupled to the drain of one of the first pair of transistors and the source of which transistor is coupled to the source of one of the second pair of transistors as well as the drain of which transistor is coupled to the first power supply.

In the level shift circuit, the second transistor (M8 shown in FIG. 8) of the second conductive type may well be further provided, the gate of which transistor is coupled to the drain of the other of the first pair of transistors and the source of which transistor is coupled to the source of the other of the second pair of transistors as well as the drain of which transistor is coupled to the first power supply.

In the level shift circuit, a fourth pair of transistors (M9 and M10 shown in FIG. 12) of the first conductive type may well be further provided, the drains of which fourth pair of transistors are coupled to the sources of the second pair of transistors and the gates and the drains of which fourth pair of transistors are cross-coupled to each other as well as the sources of which fourth pair of transistors are coupled to the first power supply in common.

In the level shift circuit, the first output terminal ('out' shown in FIG. 1) may well be provided, which terminal is coupled to the drain of one of the first pair of transistors.

In the level shift circuit, the second output terminal ('out B' shown in FIG. 1) may well be provided, which terminal is coupled to the drain of the other of the first pair of transistors.

In the level shift circuit, the third output terminal ('out 1' shown in FIG. 11) may well be provided, which terminal is coupled to the source of one of the second pair of transistors.

In the level shift circuit, the fourth output terminal ('out 1B' shown in FIG. 11) may well be provided, which terminal is coupled to the source of the other of the second pair of transistors.

According to the level shift circuit as described above, it permits the flow-through current generated upon the input signal being switched over and the duration in which such current flows to be reduced. This is because the pair of capacitative elements intervene between the pair of input nodes and the cross-coupling nodes of the third pair of transistors (the crossover coupling section of the gates and the drains thereof) operating with the second power supply, in which it is arranged such that the state of the cross-coupling section is changed immediately when the input signal has changed.

Further, the level shift circuit hereof can be configured without high maximum applicable voltage MOS transistors. This is because having such a basic configuration as the first to the third pairs of transistors being vertically stacked reduces the voltage applied between the source and the drain of each transistor.

Further, an output according to the state of the input signal can be obtained from the power-on of the circuit. This is because a transmission coefficient from the inputs to the outputs is not zero even at DC in this configuration.

Hereafter, more concrete embodiments of the present invention are explained with reference to the accompanying drawings. To note, in the following description, there is a case where p-type MOS transistors and n-type MOS transistors might be referred to simply as MOS transistors. Further, there are some cases where the same reference numerals might be allocated to terminals, nodes and signals relevant to them.

[First Exemplary Embodiment]

Figure 13:
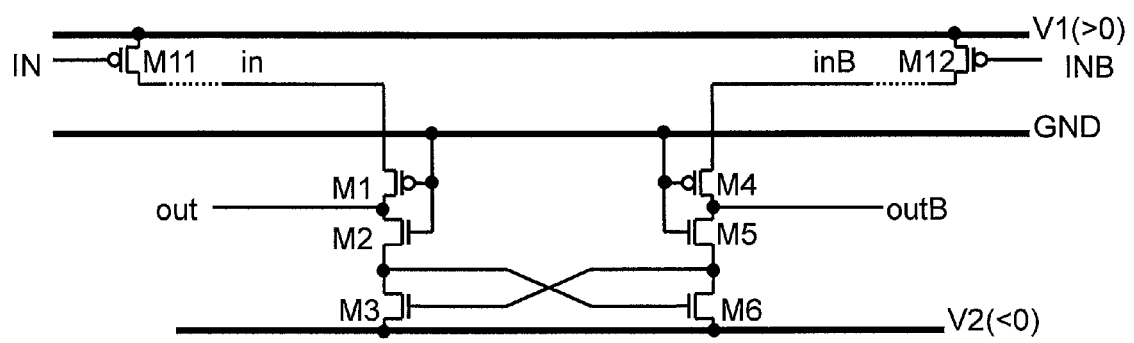
FIG. 13 is a circuit diagram of the level shift circuit according to the related art.
Figure 14:
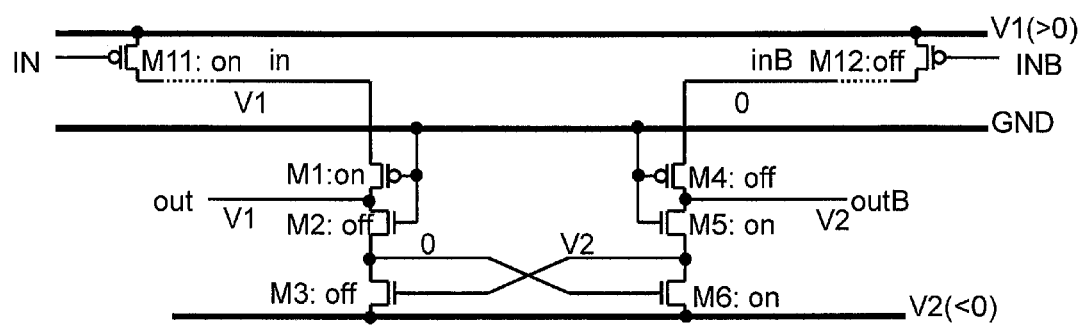
FIG. 14 is a view showing one particular state of the level shift circuit according to the related art.

FIG. 1 is a circuitry of the level shift circuit according to the first exemplary embodiment of the present disclosure, in which the same reference numerals as shown in FIG. 13 indicate the same elements. The level shift circuit is comprised of p-type MOS transistors M1, M4, M11 and M12; n-type MOS transistors M2, M3, M5 and M6; and capacitative elements C1 and C2. The gates of the MOS transistors M1 (M4) are coupled to the ground GND and their sources correspond to the input nodes 'in' ('in B'). The gates of the MOS transistors M2 (M5) are coupled to the ground GND and their drains are coupled to those of the MOS transistors M1 (M4) as well as to the output terminals 'out' ('out B') while their sources are coupled to the drains of the MOS transistors M3 (M6). The gates of the MOS transistors M3 (M6) are coupled to the drains of the MOS transistors M6 (M3) and their sources are coupled to the second power supply V2. The gates of the MOS transistors M11 (M12) are coupled to the input terminals 'IN' ('INB') and their sources are coupled to the first power supply V1 while their drains are coupled to the input nodes 'in' ('inB'). One ends of the capacitative elements C1 (C2) are coupled to the input nodes 'in' ('inB') and their other ends are coupled to the drains of the MOS transistors M3 (M6).

In the circuital arrangement as described above, such signals are inputted to the input nodes 'in' and 'inB' as its high level voltage being V1 or lower and its low level voltage being 0V or higher as well as its high level voltage being higher than its low level voltage. To note, the ground GND is 0V, and a positive voltage is supplied to the power supply V1 while a negative voltage is supplied to the power supply V2.

Figure 2:
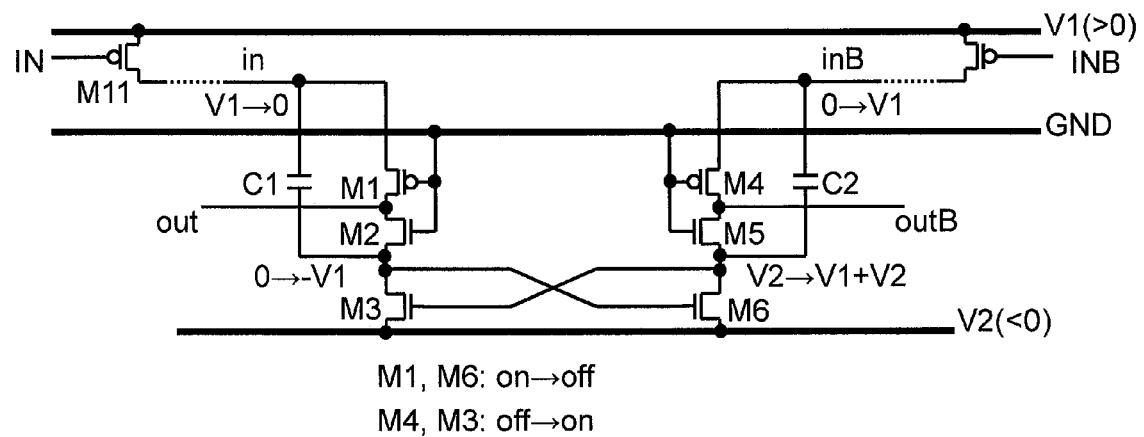
FIG. 2 is a view showing change in voltage in the level shift circuit according to the first exemplary embodiment of the present disclosure.

In FIG. 2, the situation in which the voltage of the input node 'in' changes from V1 to 0 while that of the input node 'inB' changes from 0 to V1 is shown. To note, in order to simplify the explanation, it is assumed that the gate capacitance and so forth of the MOS transistors are far lower than those of the capacitative elements C1 and C2 and accordingly change in voltage applied to one ends of those elements is reflected to their other ends without abatement. The existence of the capacitative elements C1 and C2 allows that the voltages of the input nodes, coupled nodes of the MOS transistors M2 and M3, and those of MOS transistors M5 and M6 are changed almost simultaneously. This leads that the input signal change also causes the changeover from the Off-state to the On-state of the MOS transistors M2 and M3 and that from the On-state to the Off-state of the MOS transistors M5 and M6. As a result of it, the duration and amplitude of the flow-through current are reduced. Further, a state of output signals 'out' and 'outB' according to a state of input signals 'in' and 'inB' can be obtained from the time of the power-on, similarly to the circuit of the related art shown in FIG. 13.

Figure 3:
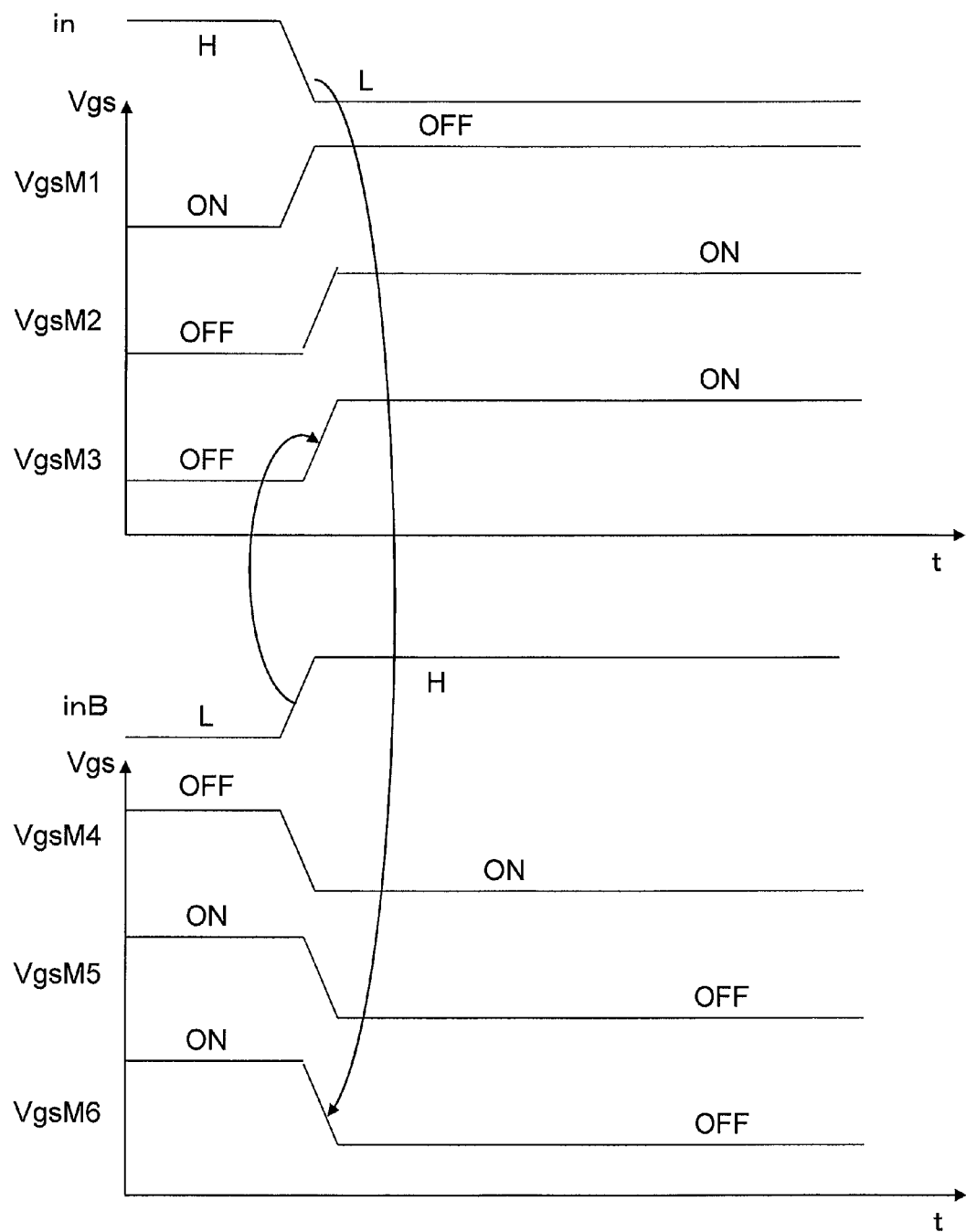
FIG. 3 is a view showing exemplarily voltage waveforms at the respective sections of the level shift circuit according to the first exemplary embodiment of the present disclosure.

Then, the voltage waveforms at the respective sections of the level shift circuit are elaborated. FIG. 3 is a view showing exemplarily voltage waveforms at the respective sections of such a circuit according to the first exemplary embodiment of the present disclosure. In FIG. 3, when the voltage of the input node 'in' changes from V1 to 0 or it changes from H level to L level, the voltage VgsM1 between the gate and the source of the MOS transistor M1 rises so that the On-state of the MOS transistor M1 changes to the Off-state. At the same time, change in voltage of the input node 'in' is transmitted through the capacitive element C1 directly to the gate of the MOS transistor M6. Accordingly, the voltage VgsM1 between the gate and the source of the MOS transistor M6 momentarily descends so that the On-state of the MOS transistor M6 changes to the Off-state in no time.

Further, when the voltage of the input node 'inB' changes from 0 to V1 or it changes from L level to H level, the voltage VgsM4 between the gate and the source of the MOS transistor M4 descends so that the Off-state of the MOS transistor M4 changes to the On-state. At the same time, change in voltage of the input node 'inB' is transmitted through the capacitive element C2 directly to the gate of the MOS transistor M3. Accordingly, the voltage VgsM3 between the gate and the source of the MOS transistor M3 momentarily rises so that the Off-state of the MOS transistor M3 changes to the On-state in no time.

As described above, in comparison with the related art shown in FIG. 13, the level shift circuit according to the present disclosure allows the On and Off state of the MOS transistors M3 and M6 to be momentarily changed according to change in voltage of the input nodes 'in' and 'inB' so as to extremely shorten the time required for switching over the input signal. Accordingly, it can largely reduce the flow-through current generated upon the input signal being switched over. Further, in the same way as the related art shown in FIG. 13, the level shift circuit hereof can be configured without using high maximum applicable voltage MOS transistors. Furthermore, an output according to the state of the input signal can be obtained from the time of the circuital power-on.

The most important thing for realizing the above-mentioned operation is that one ends of the capacitive elements C1 and C2 are coupled to the input nodes 'in' and 'inB' and their other ends are coupled to the coupling nodes of the MOS transistors M2 and M3 and those of the MOS transistors M5 and M6. Such coupling arrangement of the capacitive elements permits change in the input signal to be directly transmitted to the coupling nodes of the MOS transistors M2 and M3 and those of the MOS transistors M5 and M6 through the capacitive elements C1 and C2.

As one counterexample to explain the above, the case is presented herein where one ends of the capacitive elements C1 and C2 are coupled to the output terminals 'out' and 'outB' while their other ends are coupled to the coupling nodes of the MOS transistors M2 and M3 and to those of the MOS transistors M5 and M6. The level shift circuit in this case corresponds to what the circuit shown in FIG. 4 of Patent Document 2 is modified.

Figure 4:
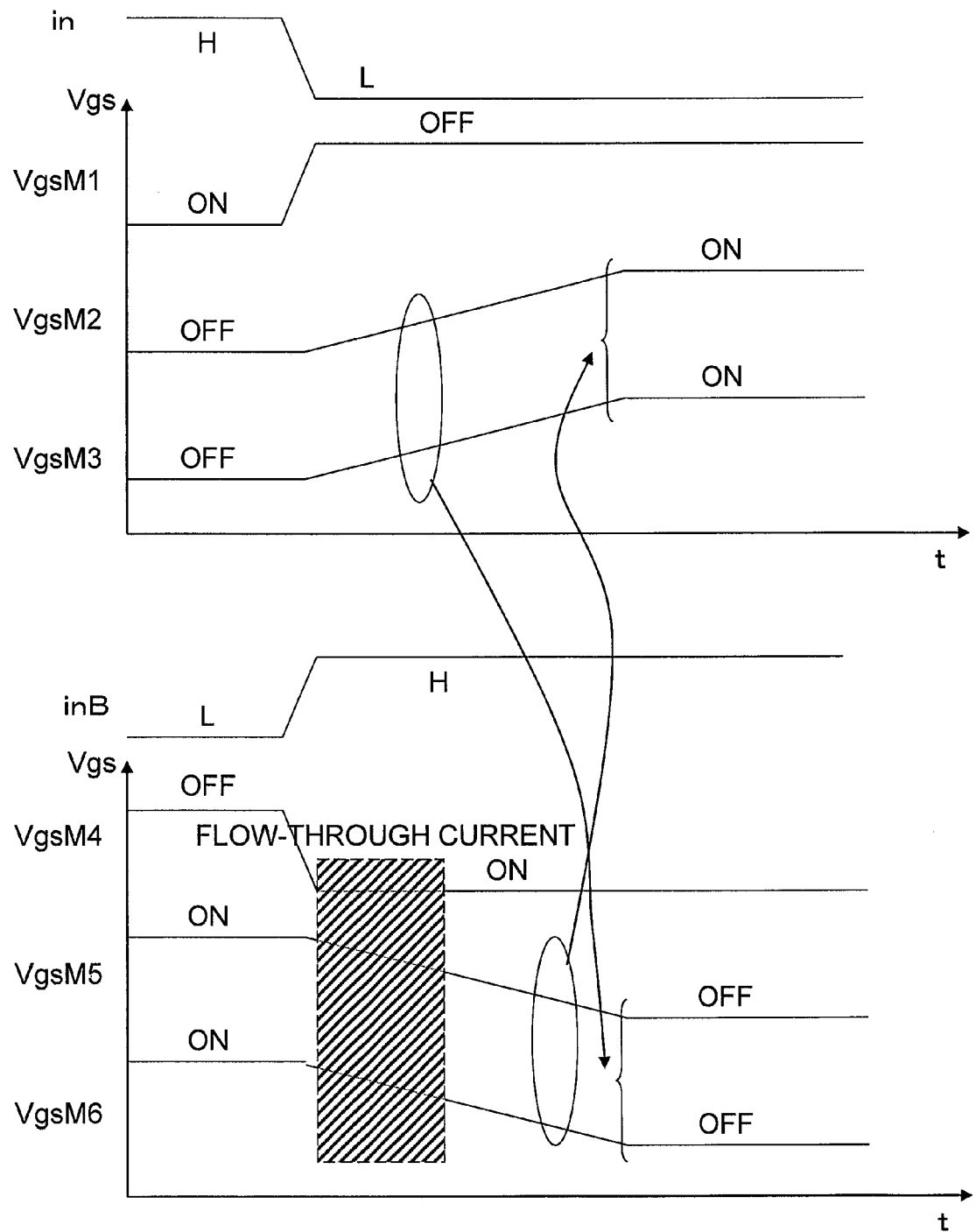
FIG. 4 is a view showing exemplarily voltage waveforms at the respective sections of the level shift circuit according to the related art.
Figure 15:
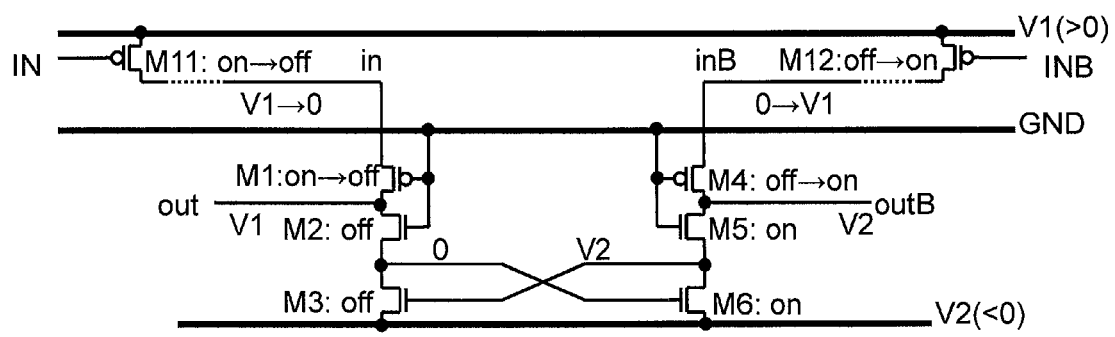
FIG. 15 is a view showing a state change in the level shift circuit according to the related art.

The waveforms at the respective sections of this level shift circuit are exemplarily shown in FIG. 4. In FIG. 4, when the voltage of the input node 'in' changes from V1 to 0 or it changes from H level to L level, the voltage VgsM1 between the gate and the source of the MOS transistor M1 rises so that the On-state of the MOS transistor M1 changes to the Off-state. In this case, as explained with reference to FIG. 15, both the MOS transistors M1 and M2 coupled to the output terminal 'out' are temporarily in the Off-state. Accordingly, the voltages VgsM2 between the gate and the source of the MOS transistor M2, and VgsM3 between the gate and the source of the MOS transistor M3 rise slowly by dint of leakage current of the MOS transistors M1 and M2 both in the Off-state. Until the voltages VgsM1 and VgsM2 reach their threshold values so that the MOS transistors M1 and M2 turn on, the MOS transistors M5 and M6 remain in the Off-state.

Thus, the duration in which the MOS transistors M4, M5 and M6 are in the on-state becomes long, and the flow-through current continues to flow during that time. In this way, with the coupling arrangement corresponding to what is shown in FIG. 4 of Patent Document 2, a high-speed switchover of the coupling nodes voltages of the MOS transistors M2 and M3 through the capacitive element C1 does not occur. Accordingly, the technical problem faced with the related art as explained with reference to FIG. 15 cannot be solved.

[Second Exemplary Embodiment]

Figure 5:
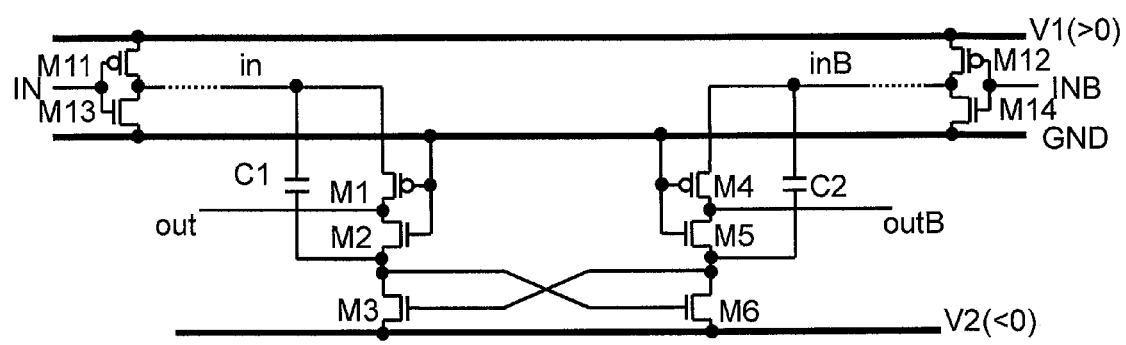
FIG. 5 is a circuit diagram of the level shift circuit according to the second exemplary embodiment of the present disclosure.

FIG. 5 is a circuit diagram of the level shift circuit according to the second exemplary embodiment of the present disclosure. In FIG. 5, the same reference numerals shown in FIG. 1 indicate the same elements. With the level shift circuit according to the present exemplary embodiment, it is arranged such that the circuit shown in FIG. 1 is further provided with n-type MOS transistors M13 and M14. The gates of the MOS transistors M13 (M14) are coupled to the input terminals 'IN' ('INB') and their sources are coupled to the ground GND while their drains are coupled to the input nodes 'in' ('inB'). Such MOS transistors M13 (M14) configure a CMOS inverter circuit together with the MOS transistors M11 (M12).

There is difference between the level shift circuit according to the present exemplary embodiment and the first exemplary embodiment in that the former is arranged such that signals applied to the input nodes 'in' ('inB') are applied by the CMOS inverter circuit. However, the essential section of the level shift circuit or that from the input nodes 'in' and 'inB' to the output terminals 'out' and 'outB' is the same as that of the circuit shown in FIG. 1. Accordingly, the resulting effect is the same as that of the first exemplary embodiment. In this way, even modifying the configuration of the anterior circuit coupled to the input nodes 'in' and 'inB' brings no change in effect brought by the level shift circuit according to the present disclosure.

To note, as for such anterior circuits, it may well be such circuits as being able to directly drive the input nodes 'in' and 'inB' with the voltage ranging from 0 to V1, so that it is needless to say that it is not limited to the MOS transistors and the CMOS inverter circuit.

[Third Exemplary Embodiment]

Figure 6:
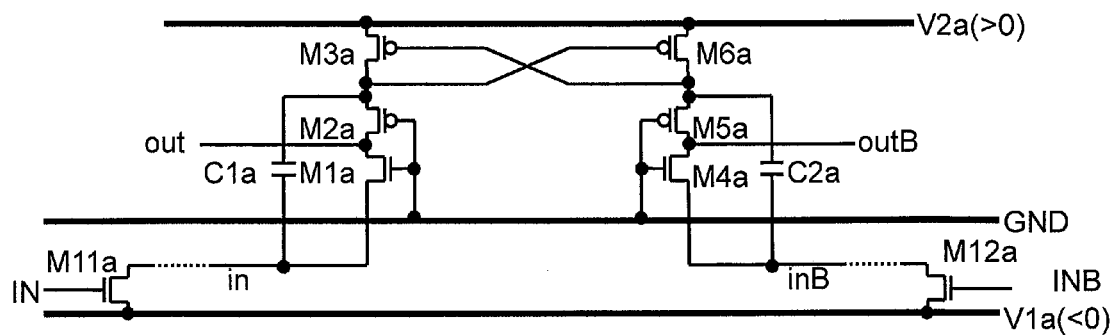
FIG. 6 is a circuit diagram of the level shift circuit according to the third exemplary embodiment of the present disclosure.

FIG. 6 is a circuit diagram of the level shift circuit according to the third exemplary embodiment of the present disclosure. In the level shift circuit according to the present exemplary embodiment, the whole n-type MOS transistors according to the first exemplary embodiment as shown in FIGS. 1 or M2, M3, M5 and M6 are replaced with p-type MOS transistors M2a, M3a, M5a and M6a while the whole p-type MOS transistors M1, M4, M11 and M12 are replaced with n-type MOS transistors M1a, M4a, M11a and M12a. Further, the supply line of the positive voltage V1 is replaced with that of the negative voltage V1a while that of the negative voltage V2 is replaced with that of the positive voltage V2a. To note, the illustration of FIG. 6 is drawn upside down such that the supply line of the positive voltage V2a is shown in the upper portion of the sheet.

The level shift circuit according to the present exemplary embodiment allows the circuit operable with the negative power voltage to transmit a signal to the circuits operable with the positive and negative power voltages. In addition, the present exemplary embodiment brings the same effect as brought by the first exemplary embodiment. That is to say, the level shift circuit according to the present exemplary embodiment permits the flow-through current generated upon the input signal being switched over and the duration in which such current flows to be further reduced in comparison with the related art. Further, the level shift circuit according to the present exemplary embodiment can be configured without using high maximum applicable voltage MOS transistors. Moreover, an output according to the state of the input signal can be obtained from the time of the power-on.

In this way, even replacing the n-type MOS transistors with the p-type ones and vice versa and at the same time reversing the positive and negative voltages applied to the power supply lines bring the same effect as that brought by the previous exemplary embodiments. This also applies to the whole exemplary embodiments as presented hereafter.

[Fourth Exemplary Embodiment]

Figure 7:
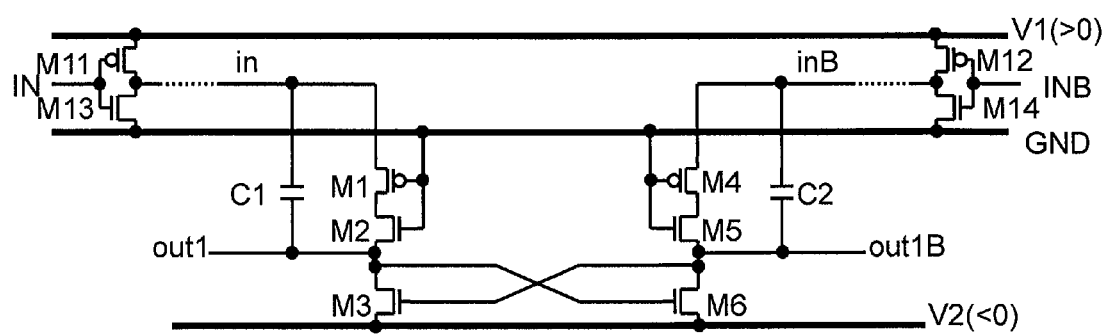
FIG. 7 is a circuit diagram of the level shift circuit according to the fourth exemplary embodiment of the present disclosure.

FIG. 7 is a circuit diagram of the level shift circuit according to the fourth exemplary embodiment of the present disclosure. In FIG. 7, the same reference numerals as shown in FIG. 5 indicate the same elements. In the level shift circuit according to the present exemplary embodiment, the arrangement of the second exemplary embodiment shown in FIG. 5 is modified such that the output takeout portions are replaced with the output terminals 'out1' and 'out1B', which terminals 'out1' and 'out1B' are coupled to the drains of the MOS transistors M3 (M6).

The above arrangement allows a signal whose high level is GND (0V) and whose low level is V2 to be obtained from the output terminals 'out1' and 'out1B'. As the input signal is a signal whose high level is V1 and whose low level is 0V, such a circuital arrangement functions as the level shift circuit.

Further, the same effect brought by the previous exemplary embodiments is brought by the present exemplary embodiment. That is to say, it allows the flow-through current generated upon the input signal being switched over and the duration in which such current flows to be further reduced in comparison with the related art. Moreover, the level shift circuit hereof can be configured without using high maximum applicable voltage MOS transistors. Moreover, an output according to the state of the input signal can be obtained from the time of the power-on.

[Fifth Exemplary Embodiment]

Figure 8:
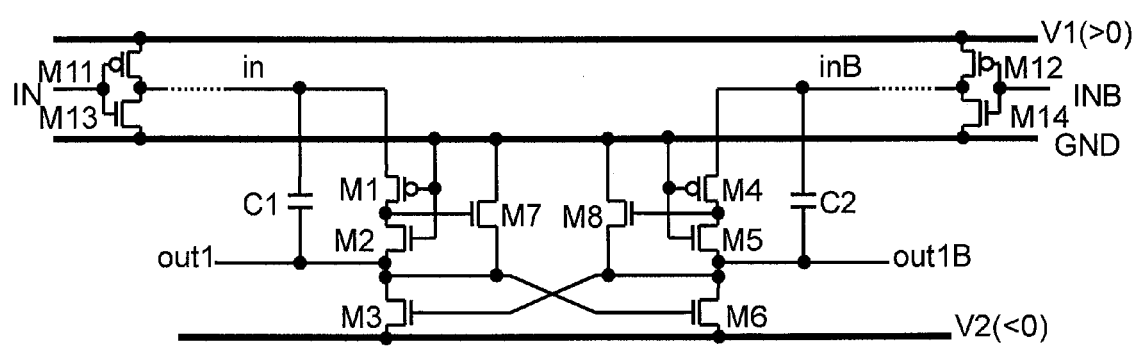
FIG. 8 is a circuit diagram of the level shift circuit according to the fifth exemplary embodiment of the present disclosure.

FIG. 8 is a circuit diagram of the level shift circuit according to the fifth exemplary embodiment of the present disclosure. In FIG. 8, the same reference numerals as shown in FIG. 7 indicate the same elements. In the level shift circuit according to the present exemplary embodiment, the level shift circuit according to the fourth exemplary embodiment as shown in FIG. 7 is further provided with n-type MOS transistors M7 and M8. The drains of the MOS transistors M7 and M8 are coupled to the ground GND and their gates are coupled to the drains of the MOS transistors M1 (M4) while their sources are coupled to the drains of the MOS transistors M3 (M6).

Figure 9:
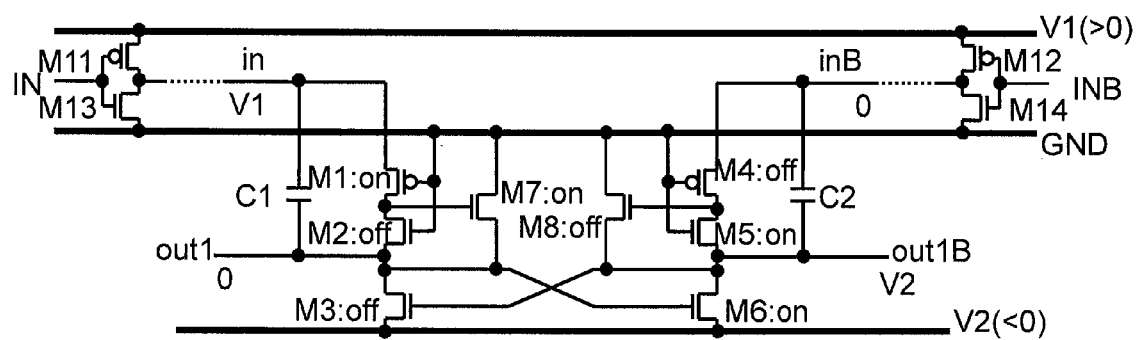
FIG. 9 is a view showing one particular state of the level shift circuit according to the fifth exemplary embodiment of the present disclosure.

Hereupon, in order to understand the roles of the MOS transistors M7 and M8, the situation in which the input node 'in' is in the high level (Voltage V1) state is shown in FIG. 9. In this case, placing the MOS transistors M2, M3 into the Off-state and the MOS transistor M7 into the On-state permits the output terminal 'out1' to be placed into the high level (0V) and low impedance state. In turn, according to the arrangement shown in FIG. 7, the MOS transistors M2 and M3 whose sources and drains are coupled to the output terminal 'out1' are in the Off-state and the MOS transistor M7 does not exist. Accordingly, a substantially high level (0V) signal appears at the output terminal 'out1', but it results in making output impedance higher or making the output driving capability smaller.

That is to say, the level shift circuit according to the present exemplary embodiment brings lower output impedance and higher output driving capability in the high level (0V) state in comparison with the counterpart according to the fourth exemplary embodiment. Further, in the same way as the fourth exemplary embodiment, the level shift circuit hereof can be configured without using high maximum applicable voltage MOS transistors, which enables the duration and amplitude of flow-through current generated upon the input signal being switched over to be further reduced in comparison with the related art. Moreover, an output according to the state of the input signal can be obtained from the time of the power-on.

[Sixth Exemplary Embodiment]

Figure 10:
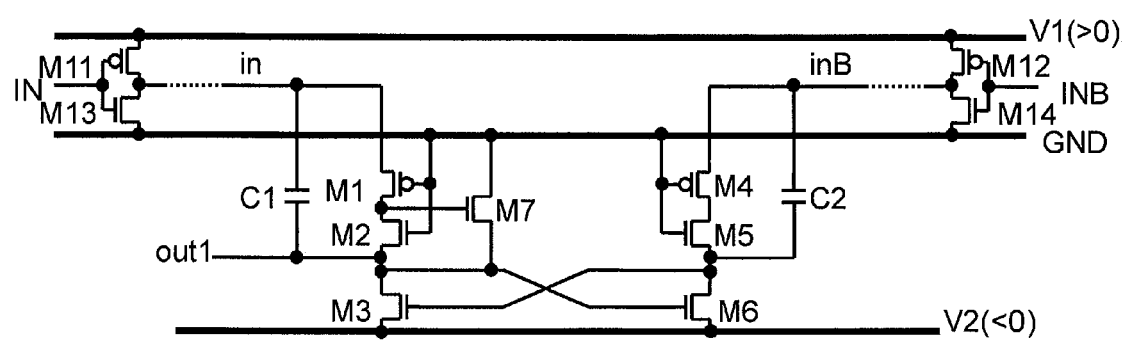
FIG. 10 is a circuit diagram of the level shift circuit according to the sixth exemplary embodiment of the present disclosure.

FIG. 10 is a circuit diagram of the level shift circuit according to the sixth exemplary embodiment of the present disclosure. In FIG. 10, the same reference numerals as shown in FIG. 8 indicate the same elements. In the level shift circuit according to the present exemplary embodiment, the MOS transistor M8 and the output terminal 'out1B' are removed from the arrangement according to the fifth exemplary embodiment as shown in FIG. 8. Such arrangements bring the same effect as brought by the counterpart of the fifth exemplary embodiment, when only the output terminal 'out1' is required.

[Seventh Exemplary Embodiment]

Figure 11:
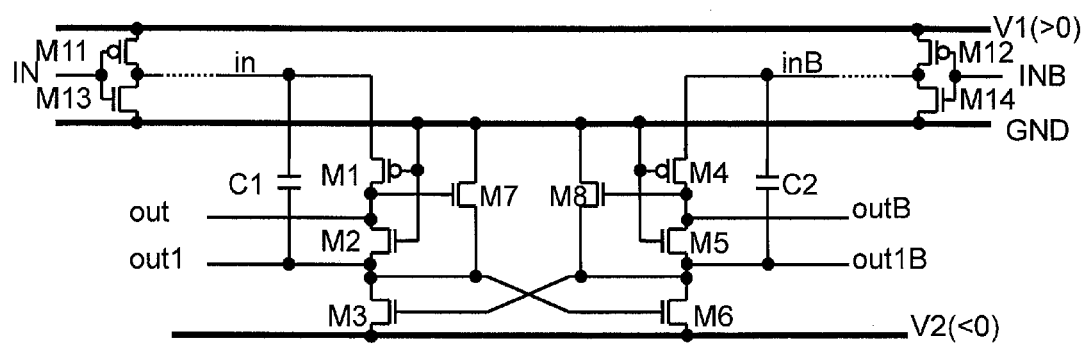
FIG. 11 is a circuit diagram of the level shift circuit according to the seventh exemplary embodiment of the present disclosure.

FIG. 11 is a circuit diagram of the level shift circuit according to the seventh exemplary embodiment of the present disclosure. In FIG. 11, the same reference numerals as shown in FIG. 7 indicate the same elements. In the level shift circuit according to the present exemplary embodiment, the output terminals 'out' and 'outB' shown in FIG. 1 are added to the arrangement of the fourth exemplary embodiment as shown in FIG. 7.

The above arrangement brings output signals of 'out' and 'outB' whose high and low levels are V1 and V2 and output signals of 'out1' and 'out1B' whose high and low levels are 0V and V2. Namely, two pairs of signals with a different set of high and low levels can be obtained from one pair of input signal whose high and low levels are V1 and 0V.

The level shift circuit according to the present exemplary embodiment brings the same effect as brought by the previous exemplary embodiments. That is to say, the level shift circuit hereof can be configured without using high maximum applicable voltage MOS transistors. Also, it allows the flow-through current generated upon the input signal being switched over and the duration in which such current flows to be further reduced in comparison with the related art. Moreover, an output according to the state of the input signal can be obtained from the time of the power-on.

[Eighth Exemplary Embodiment]

Figure 12:
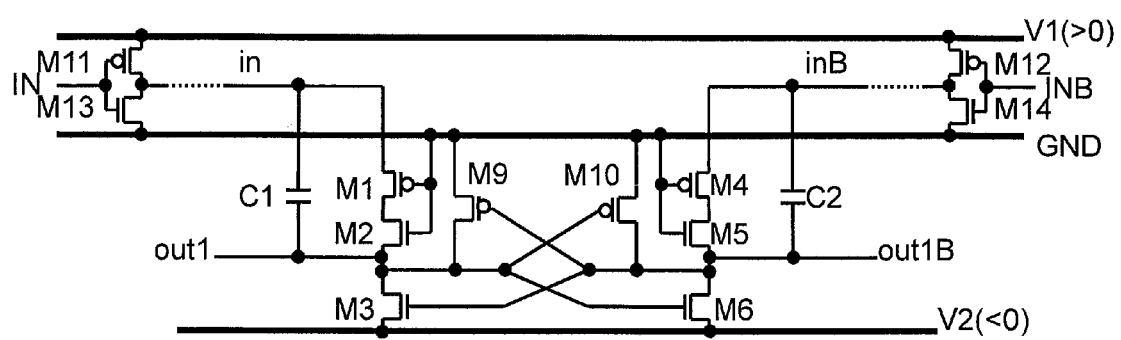
FIG. 12 is a circuit diagram of the level shift circuit according to the eighth exemplary embodiment of the present disclosure.

FIG. 12 is a circuit diagram of the level shift circuit according to the eighth exemplary embodiment of the present disclosure. In FIG. 12, the same reference numerals as shown in FIG. 7 indicate the same elements. In the level shift circuit according to the present exemplary embodiment, p-type MOS transistors M9 and M10 are added to the level shift circuit according to the fourth exemplary embodiment as shown in FIG. 7. The sources of the MOS transistors M9 (M10) are coupled to the ground GND and their gates are coupled to the drains of the MOS transistors M6 (M3) while their drains are coupled to those of the MOS transistors M3 (M6). Such MOS transistors M9 (M10) configure a CMOS inverter circuit together with the MOS transistors M3 (M6).

Accordingly, it allows the output impedance to be kept lower so as to enhance the output driving capability in the same way as the MOS transistors M7 and M8 as shown in FIG. 8. Further, the effect brought by the present exemplary embodiment is the same as brought by the fifth exemplary embodiment.

[Ninth Exemplary Embodiment]

Figure 16:
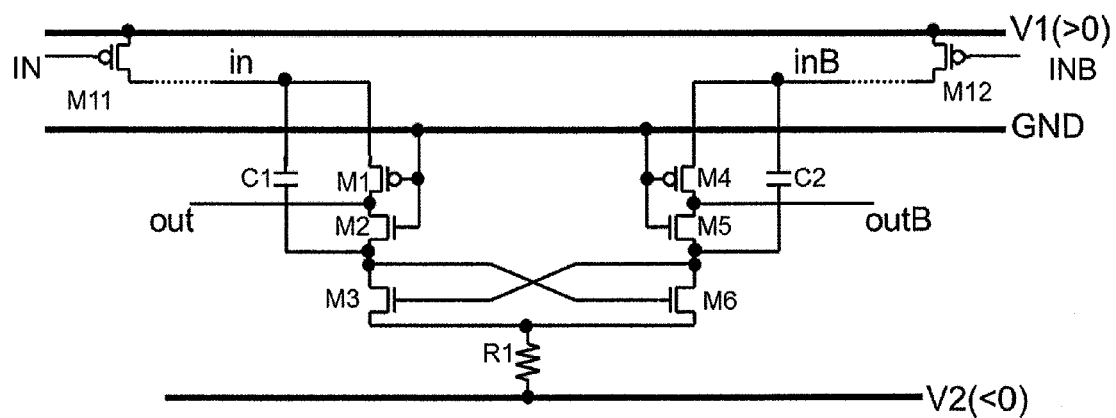
FIG. 16 is a circuit diagram of the level shift circuit according to the ninth exemplary embodiment of the present disclosure.

FIG. 16 is a circuit diagram of the level shift circuit according to the ninth exemplary embodiment of the present disclosure. In FIG. 16, the same reference numerals as shown in FIG. 1 indicate the same elements. In the level shift circuit according to the present exemplary embodiment, a resistance element R1 is added to the level shift circuit of the first exemplary embodiment as shown in FIG. 1. One end of the resistance element R1 is coupled to sources of MOS transistors M3, M6 while the other end of the resistance element R1 is coupled to the second power supply V2.

Figure 17:
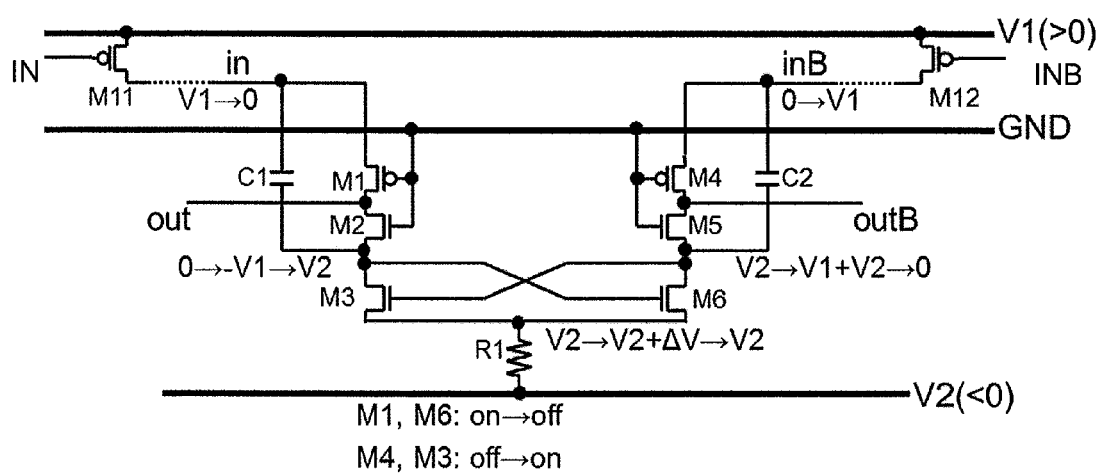
FIG. 17 is a view showing change in voltage in the level shift circuit according to the ninth exemplary embodiment of the present disclosure.

In FIG. 17, the situation in which the voltage of the input node 'in' changes from V1 to 0 while that of the input node 'inB' changes from 0 to V1 is shown. To note, in order to simplify the explanation, it is assumed that the gate capacitance and so forth of the MOS transistors are far lower than those of the capacitative elements C1 and C2 and accordingly changes in voltage applied to one ends of those elements are reflected to their other ends without abatement. The existence of the capacitative elements C1 and C2 allows that the voltages of the input nodes, coupled nodes of the MOS transistors M2 and M3, and those of the MOS transistors M5 and M6 are changed almost simultaneously. This leads that the input signal change also causes the changeover from the Off-state to the On-state of the MOS transistors M2 and M3 and that from the On-state to the Off-state of the MOS transistors M5 and M6. As a result of it, the duration and amplitude (time-average value) of the flow-through current are reduced. The operations described above are the same as that in the level shift circuit of the first exemplary embodiment illustrated in FIGS. 1, 2.

In the present exemplary embodiment, the following phenomenon occurs in addition to the above. Voltage ΔV occurs between the terminals of the resistance element R1 while the above-mentioned flow-through current flows through the resistance element R1. The source potentials of the MOS transistors M3, M6 rise by the above voltage. Since from the above, the potential between the gate and source of the MOS transistor M6 reduces, the flow-through current is suppressed. Since the MOS transistor M6 is in an On-state initially, the rise of the source voltage is transmitted to the drain. As the result, it allows the potential of the node coupled to the gate of the MOS transistor M3 to rise. That is to say, it allows the MOS transistor M3 to change from an Off-state to an On-state.

As the result, the duration and amplitude (time average value) of the flow-through current can be further reduced by providing the resistance element R1 in addition to capacitative elements C1, C2.

Figure 18:
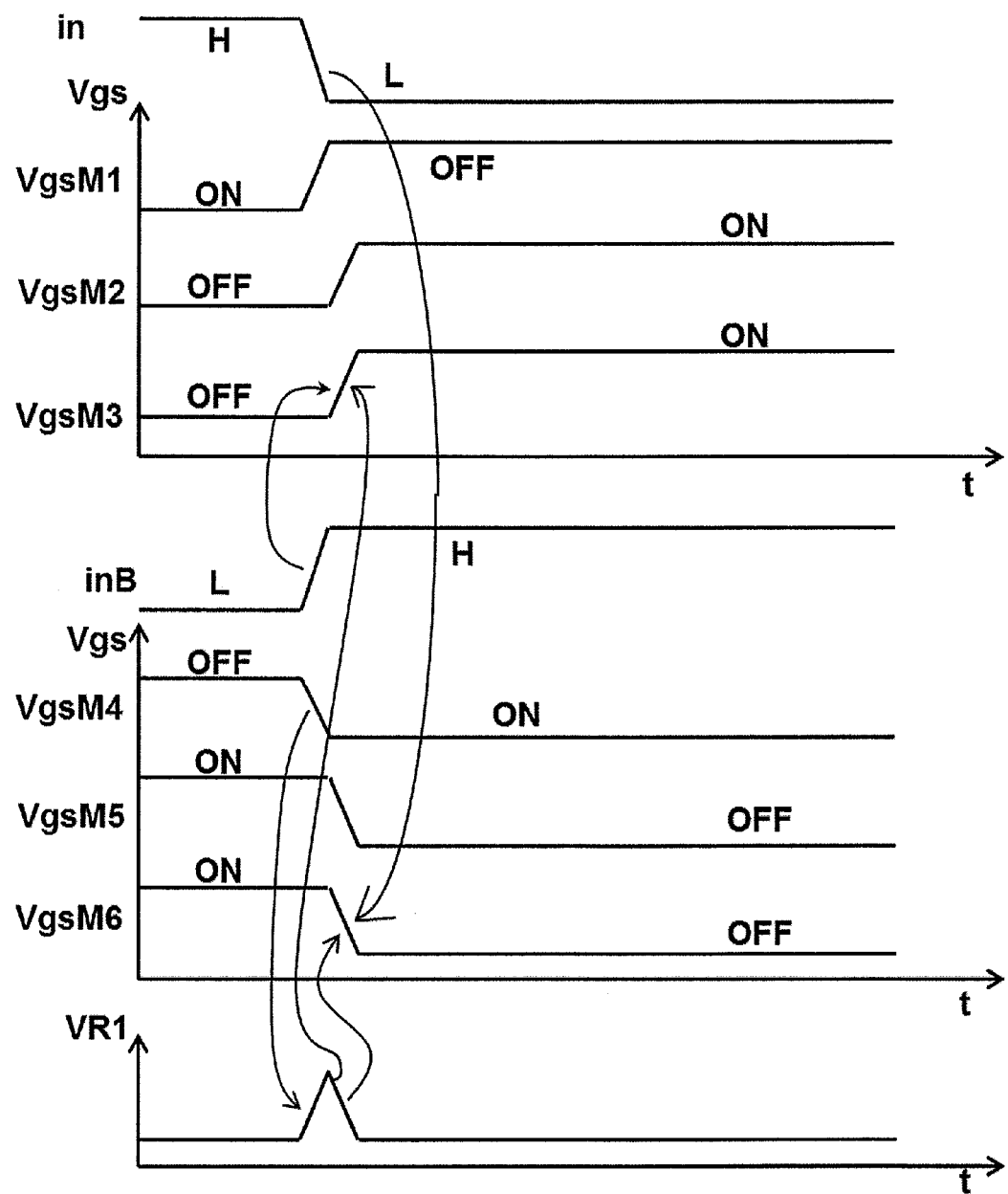
FIG. 18 is a view showing exemplarily voltage waveforms at the respective sections of the level shift circuit according to the ninth exemplary embodiment of the present disclosure.

Then, the voltage waveforms at the respective sections of the level shift circuit are elaborated. FIG. 18 is a view showing exemplarily voltage waveforms at the respective sections of the level shift circuit according to the ninth exemplary embodiment of the present disclosure. In FIG. 18, when the voltage of the input node 'in' changes from V1 to 0 or it changes from H level to L level, the voltage VgsM1 between the gate and the source of the MOS transistor M1 rises so that the On-state of the MOS transistor M1 changes to the Off-state. At the same time, change in voltage of the input node 'in' is transmitted through the capacitative element C1 directly to the gate of the MOS transistor M6. Accordingly, the voltage VgsM1 between the gate and the source of the MOS transistor M6 momentarily descends so that the On-state of the MOS transistor M6 changes to the Off-state in no time.

And the voltage of the input node 'inB' changes from 0 to V1 or it changes from L level to H level, which allows the voltage VgsM4 between the gate and the source of the MOS transistor M4 to descend so that the Off-state of the MOS transistor M4 changes to the On-state. At the same time, change in voltage of the input node 'inB' is transmitted through the capacitative element C2 directly to the gate of the MOS transistor M3. Accordingly, the voltage VgsM3 between the gate and the source of the MOS transistor M3 momentarily rises so that the Off-state of the MOS transistor M3 changes to the On-state in no time.

Moreover, there is a short time difference between a time point of changing from an Off-state to an On-state in the MOS transistor M4 and a time point of changing from an On-state to an Off-state in the MOS transistor M6 after the change of the MOS transistor M4. During the time difference, the MOS transistors M4, M5 and M6 are in an On-state at the same time, so that the flow-through current flows. The flow-through current flows through the resistance element R1, so that the voltage VR1 between the terminals of the resistance element R1 rises. The source potential of the MOS transistor M6 rises by the rise in VR1. Accordingly, the potential between the gate and the source of the MOS transistor M6 is reduced, which allows the MOS transistor M6 to change from the On-state to the Off-state. Moreover, since the MOS transistor M6 is in an On-state while the flow-through current flow, the rise of the source potential is transmitted to the drain. Since the drain of the MOS transistor M6 is coupled to the gate of the MOS transistor M3, the above phenomenon allows the MOS transistor M3 to change from the Off-state to the On-state.

As shown in the above-mentioned operation, the effects of reducing the duration and amplitude (time average value) of the flow-through current are brought by adding the capacitative elements C1, C2. The resistance element R1 works to further enhance these effects.

The above-mentioned effects brought by adding the resistance element R1, in which one end of the resistance element R1 is coupled to sources of the MOS transistors M3, M6, and the other end of that is coupled to the second power supply V2, also apply to other exemplary embodiments described previously.

[Tenth Exemplary Embodiment]

Figure 19:
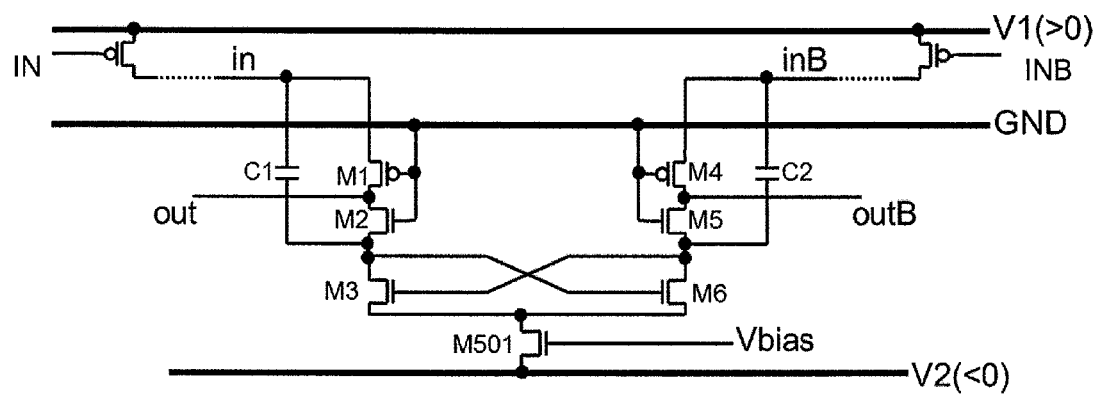
FIG. 19 is a circuit diagram of the level shift circuit according to the tenth exemplary embodiment of the present disclosure.

FIG. 19 is a circuit diagram of the level shift circuit according to the tenth exemplary embodiment of the present disclosure. In FIG. 19, the same reference numerals as shown in FIG. 16 indicate the same elements. In the level shift circuit of the present exemplary embodiment, the resistance element R1 of the level shift circuit of the ninth exemplary embodiment shown in FIG. 16 is replaced with an N-typed MOS transistor M501. A bias voltage Vbias is applied to gate of the MOS transistor M501 so as to operate nearly as a constant current source. Therefore, the effects brought are similar to that in the ninth exemplary embodiment.

The above-mentioned effects brought by adding the MOS transistor M501, in which drain of the MOS transistor M501 is coupled to sources of the MOS transistors M3, M6, and source of the MOS transistor M501 is coupled to the second power supply V2, also apply to other exemplary embodiments described previously.

[Eleventh Exemplary Embodiment]

Figure 20:
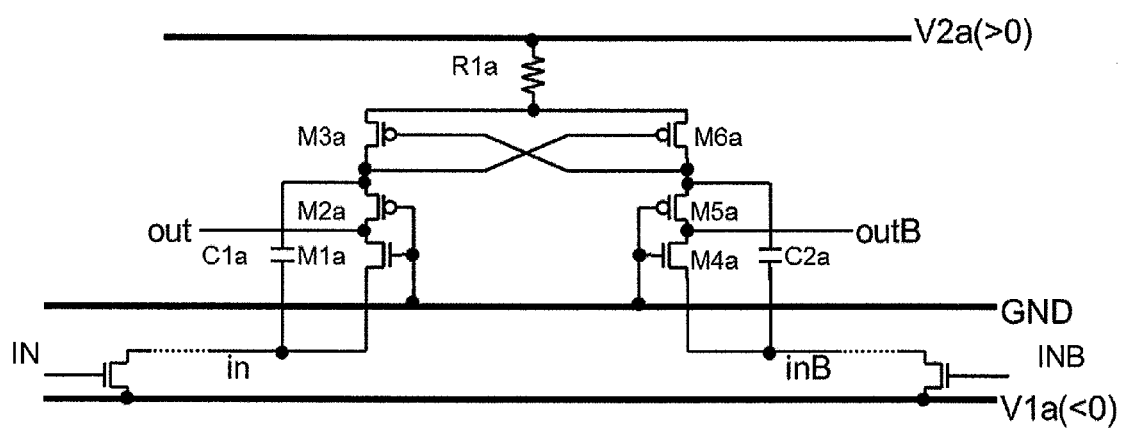
FIG. 20 is a circuit diagram of the level shift circuit according to the eleventh exemplary embodiment of the present disclosure.

FIG. 20 is a circuit diagram of the level shift circuit according to the eleventh exemplary embodiment of the present disclosure. In FIG. 20, the same reference numerals as shown in FIG. 6 indicate the same elements. In the level shift circuit of the present exemplary embodiment, a resistance element R1a is added to the level shift circuit of the third exemplary embodiment shown in FIG. 6. One end of the resistance element R1a is coupled to sources of the MOS transistors M3a, M6a while the other end of that is coupled to the second power supply V2a.

The present exemplary embodiment has a configuration in which N-typed MOS transistors are replaced with P-typed MOS transistors, and vice versa, on the basis of the configuration shown in FIG. 16, and plus and minus signs of voltages supplied to each of the power supply lines are reversed as well. The similar effects also apply to this case.

The above-mentioned effects brought by adding the resistance element R1a, in which one end of the resistance element R1a is coupled to sources of the MOS transistors M3, M6, and the other end of the resistance element R1a is coupled to the second power supply V2, also apply to other exemplary embodiments described previously.

[Twelfth Exemplary Embodiment]

Figure 21:
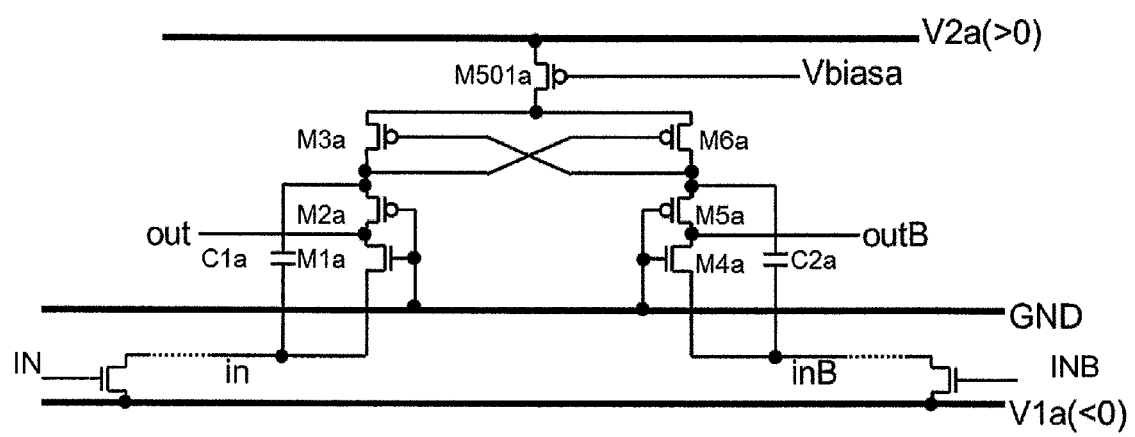
FIG. 21 is a circuit diagram of the level shift circuit according to the twelfth exemplary embodiment of the present disclosure.

FIG. 21 is a circuit diagram of the level shift circuit according to the twelfth exemplary embodiment of the present disclosure. In FIG. 21, the same reference numerals as shown in FIG. 20 indicate the same elements. In the level shift circuit of the present exemplary embodiment, the resistance element R1a of the level shift circuit of the eleventh exemplary embodiment shown in FIG. 20 is replaced with a P-typed MOS transistor M501a. A bias voltage Vbiasa is applied to gate of the MOS transistor M501a so as to operate nearly as a constant current source. Therefore, the effects brought are similar to that in the eleventh exemplary embodiment.

The above-mentioned effects brought by adding the MOS transistor M501a, in which drain of the MOS transistor M501a is coupled to sources of the MOS transistors M3a, M6a, and source of the MOS transistor M501a is coupled to the second power supply V2, also apply to other exemplary embodiments described previously.

Figure 22:
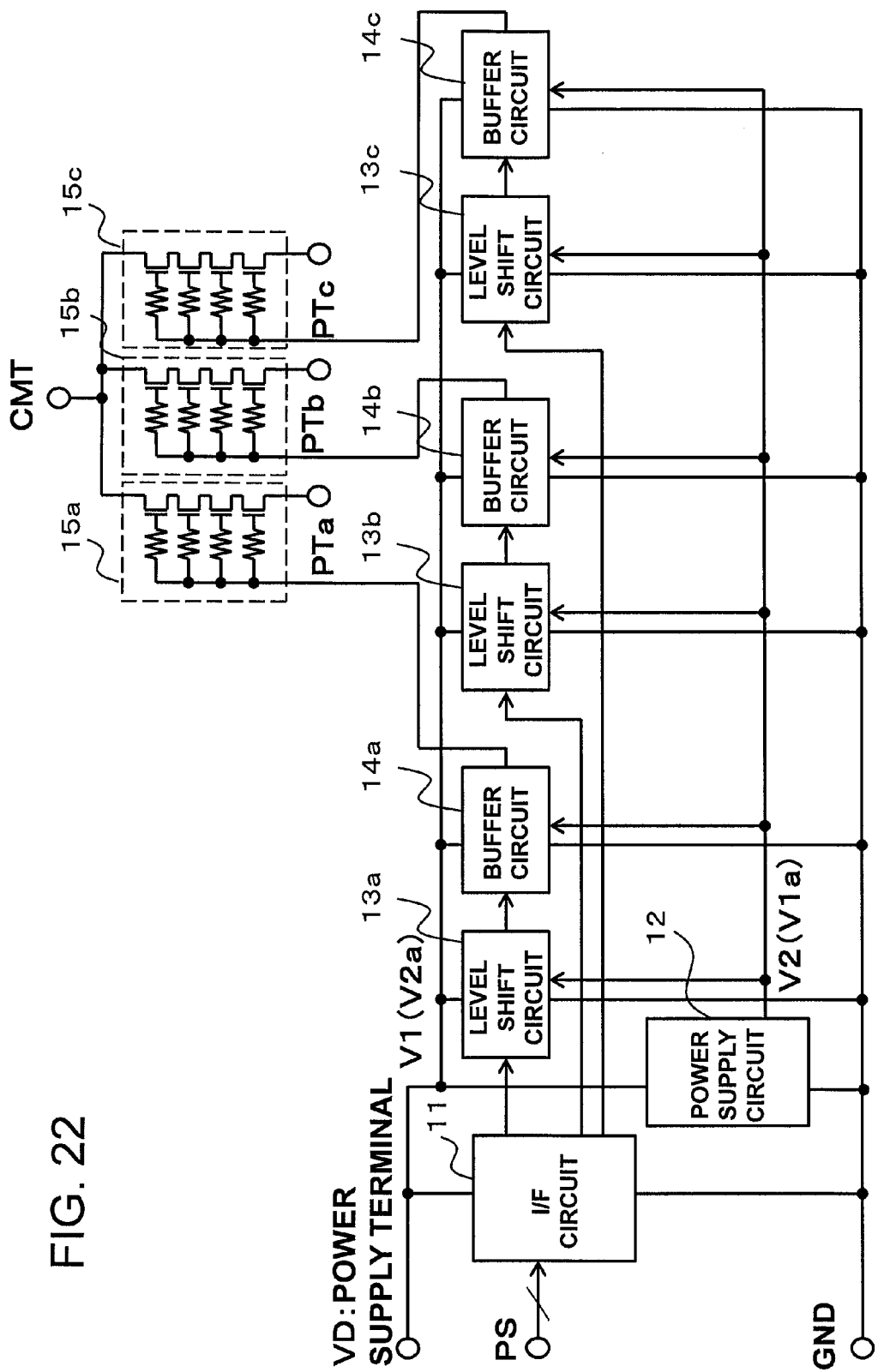
FIG. 22 is a view showing one configuration of a port selection circuit in which the level shift circuits according to the exemplary embodiments of the present disclosure are applied.

Then, an example of the application of the above-mentioned level shift circuit is elaborated. FIG. 22 is a view showing one configuration of a port selection circuit in which the level shift circuits according to the exemplary embodiments of the present disclosure are applied. In FIG. 22, a port selection circuit includes an interface circuit 11, a power supply circuit 12, level shift circuits 13a, 13b, 13c, buffer circuits 14a, 14b, 14c, switch circuits 15a, 15b, 15c, a power supply terminal VD, a ground terminal GND, a port selection terminal PS, a common terminal CMT, port terminals PTa, PTb, PTc.

The interface circuit 11 operates by a power supply between the power supply terminal VD having a voltage V1 (V2a) and the ground terminal GND, and decodes a port selection signal supplied to the port selection terminal PS as needed to drive one of the level shift circuits 13a, 13b, 13c. The power supply circuit 12 operates by power supplies of the power supply terminal VD and the ground terminal GND, and generates the voltage being lower than the ground V2 (V1a) to supply the V2 (V1a) to the level shift circuits 13a, 13b, 13c and the buffer circuits 14a, 14b, 14c.

The level shift circuits 13a, 13b, 13c control opening/closing of the switch circuits 15a, 15b, 15c via the buffer circuits 14a, 14b, 14c by the potential between the voltage V1 (V2a) and the voltage V2 (V1a). One ends of the switch circuits 15a, 15b, 15c are coupled to the port terminals PTa, PTb, PTc, respectively while the other ends of the switch circuits are coupled to the common terminal CMT in common.

One of the level shift circuits 13a, 13b, 13c makes one of the switch circuits 15a, 15b, 15c become short-state. One switch circuit of the short-state makes the path between the corresponding port terminal and the common terminal CMT to be in a short-state. In more details, in FIGS. 1, 5, 6, 16, 19, 20 and 21, a control terminal of the switch circuit is driven by the terminal out. In the case, the terminals IN, INB are controlled to be L level, H level, respectively, which makes the terminal out to be H level, and the corresponding switch circuit makes the path between the corresponding port terminal and the common terminal CMT to be in a short-state.

Figure 23:
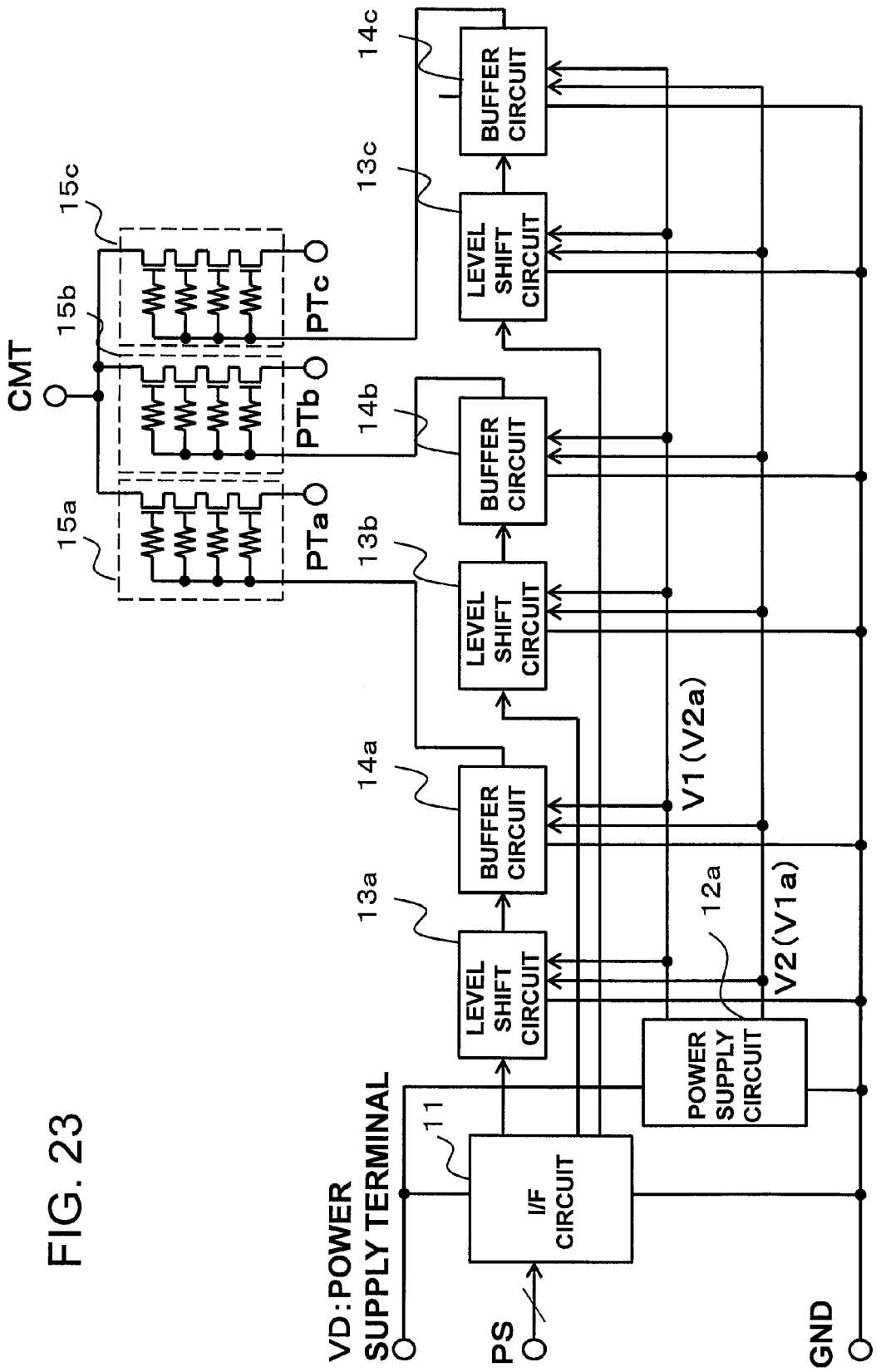
FIG. 23 is a view showing other configuration of a port selection circuit in which the level shift circuits according to the exemplary embodiments of the present disclosure are applied.

FIG. 23 is a view showing other configuration of a port selection circuit in which the level shift circuits according to the exemplary embodiments of the present disclosure are applied. In FIG. 23, the same reference numerals as shown in FIG. 22 indicate the same elements. The power supply circuit 12a operates by the power supply between the power supply terminal VD and the ground terminal GND, and generates the voltage V1 (V2a) and the voltage V2 (V1a) to supply the voltage V1 (V2a) and the voltage V2 (V1a) to the level shift circuits 13a, 13b, 13c and buffer circuits 14a, 14b, 14c as a power supply. The port selection circuit having the above configuration operates similarly as in FIG. 22.

Figure 24:
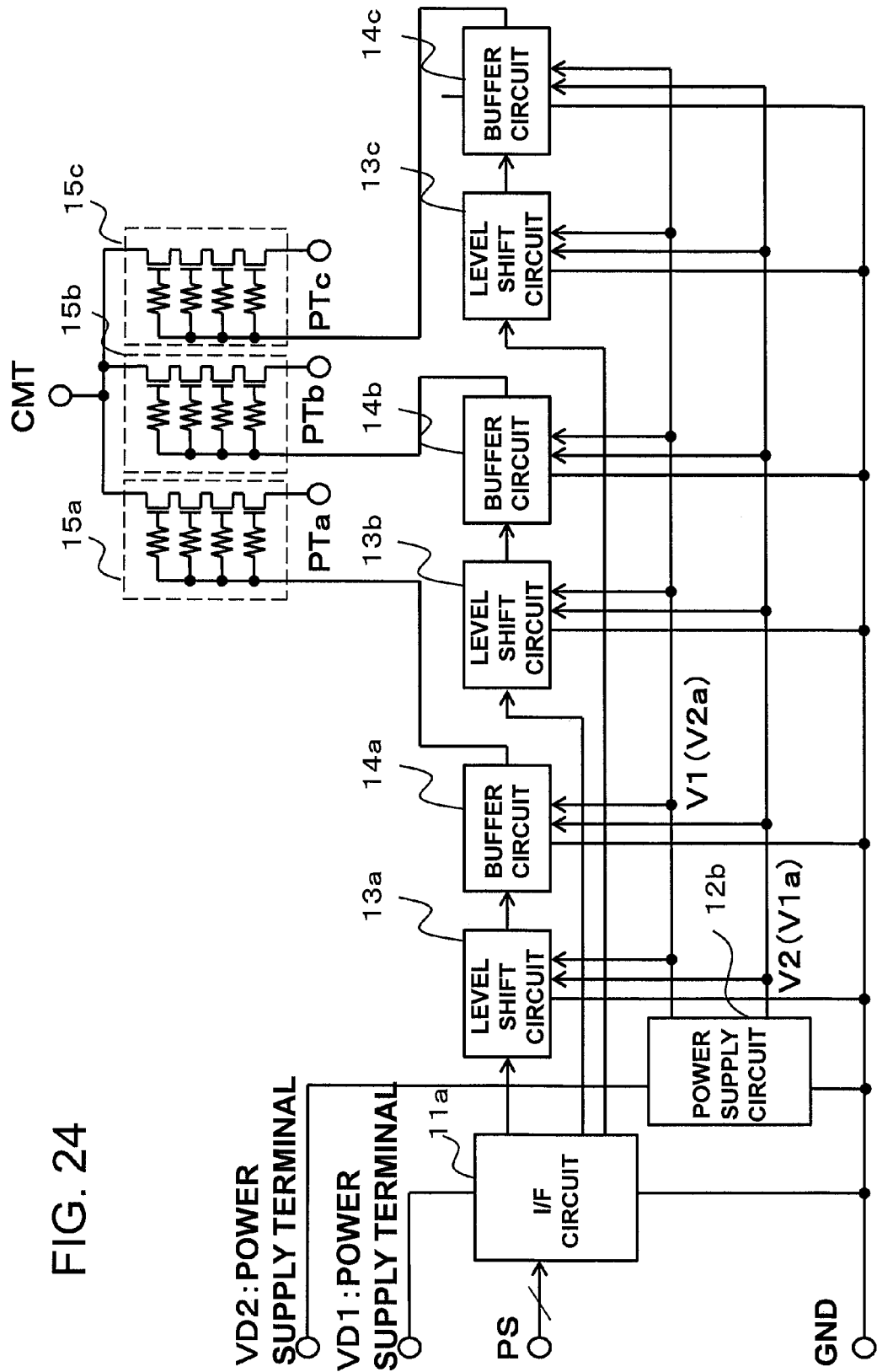
FIG. 24 is a view showing another configuration of a port selection circuit in which the level shift circuits according to the exemplary embodiments of the present disclosure are applied.

FIG. 24 is a view showing another configuration of a port selection circuit in which the level shift circuits according to the exemplary embodiments of the present disclosure are applied. In FIG. 24, the same reference numerals as shown in FIG. 23 indicate the same elements. In the port selection circuit having this configuration, a power supply of the interface circuit 11a is supplied from the power supply terminal VD1, and a power supply of the power supply circuit 12b is supplied from the power supply terminal VD2. The power supply circuit 12b operates by a power supply between the power supply terminal VD2 and the ground terminal GND, and generates the voltage V1 (V2a) and the voltage V2 (V1a) to supply the voltage V1 (V2a) and the voltage V2 (V1a) to the level shift circuits 13a, 13b, 13c and the buffer circuit 14a, 14b, 14c. The port selection circuit having the above configuration operates similarly as in FIG. 23.

Figure 25:
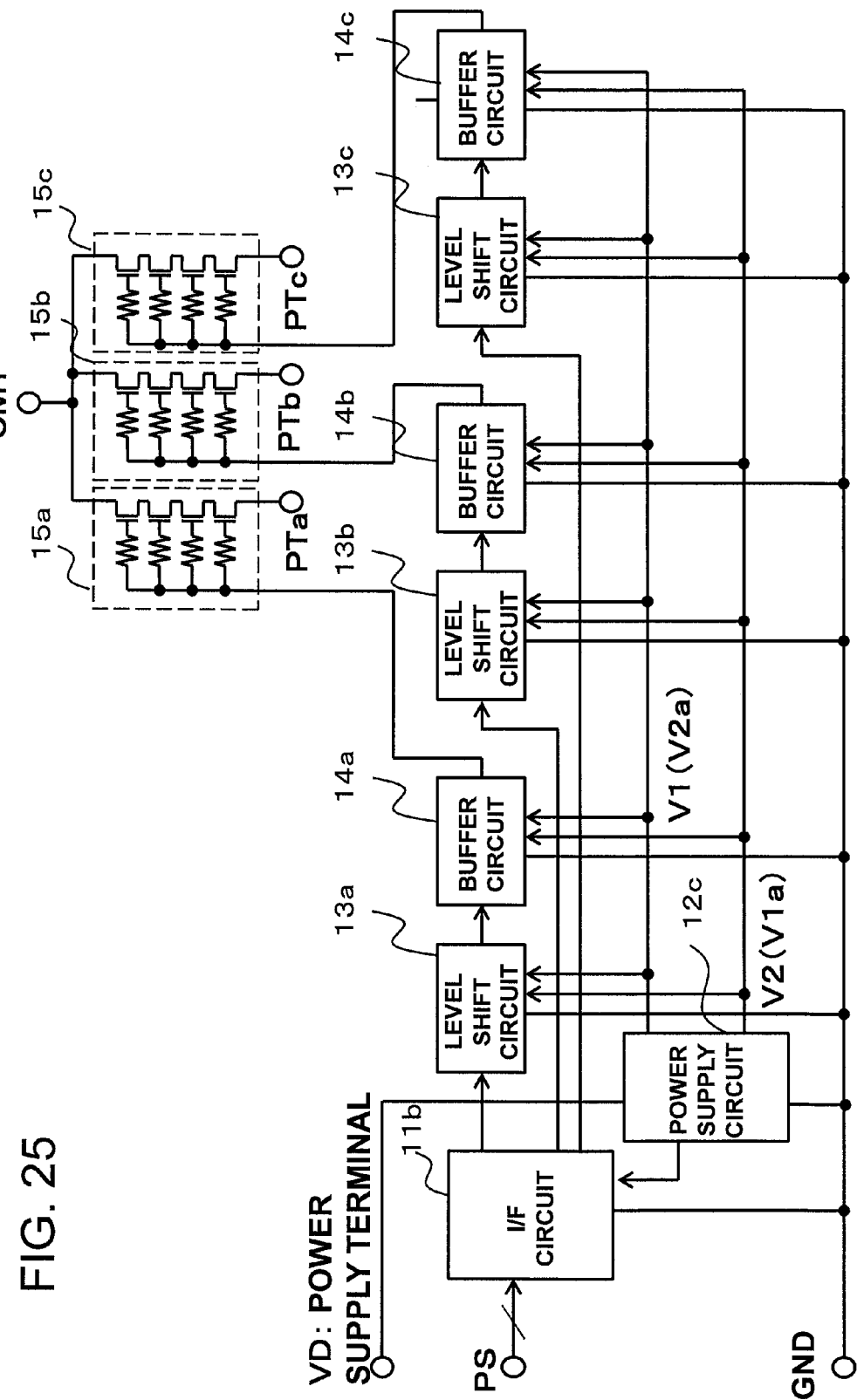
FIG. 25 is a view showing one more another configuration of a port selection circuit in which the level shift circuits according to the exemplary embodiments of the present disclosure are applied.

FIG. 25 is a view showing one more another configuration of a port selection circuit in which the level shift circuits according to the exemplary embodiments of the present disclosure are applied. In FIG. 25, the same reference numerals as shown in FIG. 23 indicate the same elements. In the port selection circuit having this configuration, a power supply of the interface circuit 11a is provided from the power supply circuit 12c, and a power supply of the power supply circuit 12c is provided from the power supply terminal VD. The power supply circuit 12c operates by a power supply between the power supply terminal VD and the ground terminal GND, and generates the voltage V1 (V2a) and the voltage V2 (V1a) to supply the voltage V1 (V2a) and the voltage V2 (V1a) to the level shift circuits 13a, 13b, 13c and the buffer circuits 14a, 14b, 14c, respectively. The port selection circuit having the above configuration operates similarly as in FIG. 23.

Each of the elements mentioned above may be or may be not integrated to a single integrated circuit (IC). The buffer circuits 14a, 14b, 14c may be omitted, so that the level shift circuits 13a, 13b, 13c may drive the switch circuits 15a, 15b, 15c directly. Moreover, FETs (Field effect transistor) constituting the switch circuits 15a, 15b, 15c include back gate terminals, and circuit blocks having similar configuration including the level shift circuits can be used for changeover of power feeding to the back gate terminals. The level shift circuit of the present exemplary embodiment can be also used for a switch circuit having various topologies in the switch section such as a DP3T (Double-Pole Triple Throw) switch having two common terminals CMT, a switch having a different number of ports, a switch circuit further including a branch that couples a non-selective port(s) to the ground at high frequencies.

Figure 26:
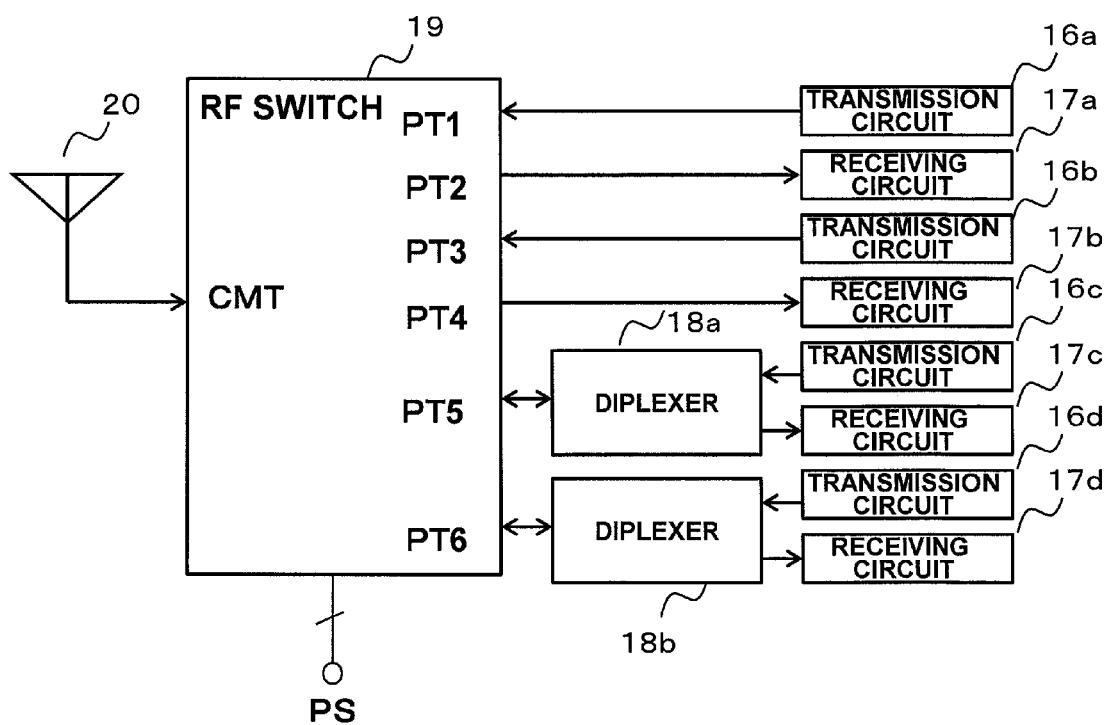
FIG. 26 is a view showing a configuration of a mobile wireless terminal device in which the level shift circuits according to the exemplary embodiments of the present disclosure are applied.

FIG. 26 is a view showing a configuration of a mobile wireless terminal device in which the level shift circuits according to the exemplary embodiments of the present disclosure are applied. In FIG. 26, the mobile wireless terminal device includes transmission circuits 16a-16d, receiving circuits 17a-d, diplexers 18a, 18b, a port selection circuit 19, an antenna 20. In the mobile wireless terminal device, the only sections regarding the antenna and the transmission and reception circuits are shown, but other circuits are omitted to be shown. Signal lines for changeover in the ports, on/off control of the respective transmission circuits and receiving circuits are omitted to be shown. In fact, there are other blocks that perform the above controls, control lines between the blocks and the respective elements are disposed. Power supply, ground etc. are omitted to be shown, however, in fact, these are supplied to the respective blocks.

The port selection circuit 19 is a circuit as shown in FIGS. 22-25. Here, the port selection circuit 19 operates as a RF (Radio Frequency) switch with six built-in port terminals PT1-PT6 and six built-in switch circuits. A common terminal CMT is coupled to the antenna 20; the port terminals PT1-PT6 are coupled to the transmission circuit 16a, the reception circuit 17a, the transmission circuit 16b, the reception circuit 17b, one end of the diplexer 18a, and one end of the diplexer 18b, respectively.

Diplexers 18a, 18b are circuits for sharing the single antenna so as to perform a transmission and a reception simultaneously in a cellular phone using FDD (Frequency Division Duplex) method. The diplexers 18a, 18b couple the transmission circuit 16c and the receiving circuit 17c, the transmission circuit 16d and the receiving circuit 17d to the port selection circuit 19, respectively.

Here, the port terminals PT1-PT4 are ports for TDD (Time Division Duplex) system; the port terminals PT5, PT6 are ports for FDD system. Frequency band of the port terminal PT1, PT2 may be different from that of the port terminals PT3, PT4. Or, a communication method of a system in which the port terminals PT1, PT2 are used may be different from that in which the port terminals PT3, PT4. Also, frequency band of the port terminal PT5 may be different from that of the port terminal PT6. Or a communication method of a system in which the port terminal PT5 is used may be different from that in which the port terminal PT6 is used.

Meanwhile, FIG. 26 shows one example of the configuration. Various combinations in the number of port terminals of the switch and the number of common terminals are possible depending on difference of the number of applied systems and the number of antennas included in the terminal. The level shift circuit in accordance with the present exemplary embodiment can be used regardless of the above combination. And the RF switch may be a single IC, a module including a plurality of ICs, or a unit including a plurality of discrete devices and ICs To note, the disclosures of the aforementioned patent documents are incorporated herein by reference. The preferred exemplary embodiments or examples described herein can be modified or adjusted within the technical scope of the whole disclosure (including the scope of the accompanying patent claims) of the present invention and based on the fundamental technical concepts thereof. Further, various disclosure elements (including respective features recited in the accompanying claims, those described in the above exemplary embodiments, those shown in the accompanying drawings and so forth) can be combined or be selected within the scope of the accompanying patent claims. Namely, such various modifications or corrections as it would have been easy to the persons skilled in the art to make based on the whole disclosure including the accompanying patent claims and the technical concepts of the present invention also belong to the technical scope of the present invention.

Regarding matters that are added or amended in the present application the filing date of the present application should be treated as a base date, whereas disclosed matters as basis for the right of priority are not affected by the above added or amended matters at all by considering as matters to be described based on the priority date, and should be treated similarly as priority under the Paris Convention.

What is claimed is:

1. A level shift circuit comprising:
   a first pair of transistors of a first conductive type, sources of the first pair of transistors being coupled to a pair of input nodes and gates of the first pair of transistors being coupled to a first power supply in common;
   a second pair of transistors of a second conductive type, drains of the second pair of transistors being coupled to drains of the first pair of transistors and gates of the second pair of transistors being coupled to the first power supply in common;
   a third pair of transistors of the second conductive type, drains of the third pair of transistors being coupled to sources of the second pair of transistors, and gates and drains of the third pair of transistors being cross-coupled to each other while sources of the third pair of transistors are coupled to a second power supply in common;
   a pair of capacitive elements, one ends of the capacitive elements being coupled to the pair of input nodes while other ends of the capacitive elements are coupled to the drains of the third pair of transistors; and
   a first transistor of the second conductive type, a gate of the first transistor being coupled to a drain of one of the first pair of transistors and a source of the first transistor being coupled to a source of one of the second pair of transistors while a drain of the first transistor is coupled to the first power supply.

2. The level shift circuit according to claim 1, further comprising:
   a second transistor of the second conductive type, a gate of the second transistor being coupled to a drain of the other of the first pair of transistors and a source of the second transistor being coupled to a source of the other of the second pair of transistors while a drain of the second transistor is coupled to the first power supply.

3. A level shift circuit comprising:
   a first pair of transistors of a first conductive type, sources of the first pair of transistors being coupled to a pair of input nodes and gates of the first pair of transistors being coupled to a first power supply in common;
   a second pair of transistors of a second conductive type, drains of the second pair of transistors being coupled to drains of the first pair of transistors and gates of the second pair of transistors being coupled to the first power supply in common;
   a third pair of transistors of the second conductive type, drains of the third pair of transistors being coupled to sources of the second pair of transistors, and gates and drains of the third pair of transistors being cross-coupled to each other while sources of the third pair of transistors are coupled to a second power supply in common;
   a pair of capacitive elements, one ends of the capacitive elements being coupled to the pair of input nodes while other ends of the capacitive elements are coupled to the drains of the third pair of transistors; and a fourth pair of transistors of the first conductive type, drains of the fourth pair of transistors being coupled to the sources of the second pair of transistors and gates and drains of the fourth pair of transistors being cross-coupled to each other while sources of the fourth pair of transistors are coupled to the first power supply in common.

4. The level shift circuit according to claim 1, comprising:
a first output terminal coupled to the drain of the one of the first pair of transistors.

5. The level shift circuit according to claim 4, comprising:
a second output terminal coupled to the drain of the other of the first pair of transistors.

6. The level shift circuit according to claim 1, comprising:
a third output terminal coupled to the source of the one of the second pair of transistors.

7. The level shift circuit according to claim 6, comprising:
a fourth output terminal coupled to the source of the other of the second pair of transistors.

8. A port selection circuit comprising:
a switch circuit; and
a level shift circuit, including:
- a first pair of transistors of a first conductive type, sources of the first pair of transistors being coupled to a pair of input nodes and gates of the first pair of transistors being coupled to a first power supply in common;
- a second pair of transistors of a second conductive type, drains of the second pair of transistors being coupled to drains of the first pair of transistors and gates of the second pair of transistors being coupled to the first power supply in common;
- a third pair of transistors of the second conductive type, drains of the third pair of transistors being coupled to sources of the second pair of transistors and gates and drains of the third pair of transistors being cross-coupled to each other while sources of the third pair of transistors are coupled to a second power supply in common;
- a pair of capacitive elements, one ends of the capacitive elements being coupled to the pair of input nodes while other ends of the capacitive elements are coupled to the drains of the third pair of transistors; and
- a first transistor of the second conductive type, a gate of the first transistor being coupled to a drain of one of the first pair of transistors and a source of the first transistor being coupled to a source of one of the second pair of transistors while a drain of the first transistor is coupled to the first power supply, wherein said pair of input nodes is driven between a third power supply potential and said first power supply potential, and
wherein a control terminal of said switch circuit is driven to said third or second power supply potential by means of said level shift circuit.

9. A mobile wireless terminal device comprising:
an antenna;
a transmission circuit and a receiving circuit; and a port selection circuit, including:
a switch circuit; and
a level shift circuit,
wherein the level shift circuit includes:
- a first pair of transistors of a first conductive type, sources of the first pair of transistors being coupled to a pair of input nodes and gates of the first pair of transistors being coupled to a first power supply in common;
- a second pair of transistors of a second conductive type, drains of the second pair of transistors being coupled to drains of the first pair of transistors and gates of the second pair of transistors being coupled to the first power supply in common;
- a third pair of transistors of the second conductive type, drains of the third pair of transistors being coupled to sources of the second pair of transistors and gates and drains of the third pair of transistors being cross-coupled to each other while sources of the third pair of transistors are coupled to a second power supply in common;
- a pair of capacitive elements, one ends of the capacitive elements being coupled to the pair of input nodes while other ends of the capacitive elements are coupled to the drains of the third pair of transistors; and
- a first transistor of the second conductive type, a gate of the first transistor being coupled to a drain of one of the first pair of transistors and a source of the first transistor being coupled to a source of one of the second pair of transistors while a drain of the first transistor is coupled to the first power supply, wherein said pair of input nodes is driven between a third power supply potential and said first power supply potential,
wherein a control terminal of said switch circuit is driven to said third or second power supply potential by means of said level shift circuit, and
wherein one end of said switch circuit is coupled to said antenna while the other end of said switch circuit is coupled to any one of or both of said transmission circuit and said receiving circuit.

10. The port selection circuit according to claim 8,
wherein the level shift circuit further comprises:
a second transistor of the second conductive type, a gate of the second transistor being coupled to a drain of the other of the first pair of transistors and a source of the second transistor being coupled to a source of the other of the second pair of transistors while a drain of the second transistor is coupled to the first power supply.

11. The mobile wireless terminal device according to claim 9,
wherein the level shift circuit further comprising:
a second transistor of the second conductive type, a gate of the second transistor being coupled to a drain of the other of the first pair of transistors and a source of the second transistor being coupled to a source of the other of the second pair of transistors while a drain of the second transistor is coupled to the first power supply.

* * * * *